US010089258B2

(12) United States Patent
Kubo et al.

(10) Patent No.: US 10,089,258 B2
(45) Date of Patent: Oct. 2, 2018

(54) SEMICONDUCTOR INTEGRATED CIRCUIT, AND DATA INTERFACE SYSTEM PROVIDED WITH SAME, WHICH PROVIDES FOR DYNAMIC CONTROL OF THE SUPPLY VOLTAGE

(71) Applicant: Socionext Inc., Kanagawa (JP)

(72) Inventors: Hironori Kubo, Osaka (JP); Norihiko Mizobata, Osaka (JP); Makoto Hirano, Osaka (JP); Akihiro Suzuki, Osaka (JP); Masahiro Takeuchi, Osaka (JP)

(73) Assignee: SOCIONEXT INC., Kanagawa (JP)

( * ) Notice: Subject to any disclaimer, the term of this patent is extended or adjusted under 35 U.S.C. 154(b) by 279 days.

(21) Appl. No.: 14/964,435

(22) Filed: Dec. 9, 2015

(65) Prior Publication Data

US 2016/0091943 A1 Mar. 31, 2016

Related U.S. Application Data

(63) Continuation of application No. PCT/JP2014/001890, filed on Mar. 31, 2014.

(30) Foreign Application Priority Data

Jun. 11, 2013 (JP) .................................. 2013-122327

(51) Int. Cl.
*G06F 13/16* (2006.01)
*G11C 5/14* (2006.01)
(Continued)

(52) U.S. Cl.
CPC ............ *G06F 13/1689* (2013.01); *G05F 1/12* (2013.01); *G11C 5/147* (2013.01); *G06F 1/3243* (2013.01);
(Continued)

(58) Field of Classification Search
CPC ..... G11C 5/147; G11C 29/028; G06F 13/1689
See application file for complete search history.

(56) References Cited

U.S. PATENT DOCUMENTS

2002/0017688 A1   2/2002 Noguchi
2002/0147949 A1*  10/2002 Lamb .................... G11C 5/147
                                                714/718
(Continued)

FOREIGN PATENT DOCUMENTS

JP    2002-015599 A    1/2002
JP    2007-164970 A    6/2007
(Continued)

OTHER PUBLICATIONS

International Search Report dated Jun. 10, 2014, issued in corresponding International Application No. PCT/JP2014/001890. (w/ partial English translation).
(Continued)

*Primary Examiner* — Albert C Wang
(74) *Attorney, Agent, or Firm* — McDermott Will & Emery LLP

(57) ABSTRACT

A semiconductor integrated circuit operates with a voltage supplied from a first power supply IC to transmit and receive data to and from an external memory. The semiconductor integrated circuit includes: an interface circuit operating with a voltage supplied from a second power supply IC and accessing the external memory to transmit and receive data to and from the external memory; a determination circuit which determines, based on a result of the access by the interface circuit, an AC timing specification between the external memory and the interface circuit to generate control information for controlling an output voltage of the second power supply IC in accordance with the AC timing specification; and a voltage control circuit which controls the
(Continued)

output voltage of the second power supply IC in accordance with the control information.

11 Claims, 6 Drawing Sheets

(51) Int. Cl.
  *G05F 1/12* (2006.01)
  *G06F 1/32* (2006.01)
(52) U.S. Cl.
  CPC .......... *G06F 1/3296* (2013.01); *Y02D 10/152* (2018.01); *Y02D 10/172* (2018.01)

(56) References Cited

U.S. PATENT DOCUMENTS

| | | | |
|---|---|---|---|
| 2006/0142977 A1* | 6/2006 | Oh | G11C 5/147 702/190 |
| 2007/0133299 A1 | 6/2007 | Chen et al. | |
| 2008/0086650 A1* | 4/2008 | Ozawa | G06F 1/3203 713/310 |
| 2012/0069686 A1 | 3/2012 | Nakabayashi | |
| 2014/0229666 A1* | 8/2014 | Schoenborn | G11C 29/06 711/105 |

FOREIGN PATENT DOCUMENTS

| | | |
|---|---|---|
| JP | 2009-217685 A | 9/2009 |
| JP | 2011-003088 A | 1/2011 |

OTHER PUBLICATIONS

Chinese Office Action dated Dec. 18, 2017 issued in Chinese Patent Application No. 201480030636.9 (with partial English translation).

\* cited by examiner

SEMICONDUCTOR INTEGRATED CIRCUIT, AND DATA INTERFACE SYSTEM PROVIDED WITH SAME, WHICH PROVIDES FOR DYNAMIC CONTROL OF THE SUPPLY VOLTAGE

CROSS-REFERENCE TO RELATED APPLICATIONS

This is a continuation of International Application No. PCT/JP2014/001890 filed on Mar. 31, 2014, which claims priority to Japanese Patent Application No. 2013-122327 filed on Jun. 11, 2013. The entire disclosures of these applications are incorporated by reference herein.

BACKGROUND

The present disclosure relates to a semiconductor integrated circuit, and more particularly relates to a semiconductor integrated circuit which transmits and receives data to and from an external memory.

Power consumption of semiconductor integrated circuits tends to increase in recent years with improvement of their performance and processing speeds. On the other hand, there are increasing demands for reducing their power dissipation.

In general, the power dissipation of a semiconductor integrated circuit can be reduced by dynamic control of a voltage supplied to an internal circuit of the semiconductor integrated circuit.

However, when a dynamic change is made to a supply voltage supplied to an interface (IF) circuit serving as an internal circuit and performing a data transmission/reception operation with an external memory, an alternate current (AC) timing specification between the external memory and the IF circuit is no longer met, which may disable access to the memory.

Japanese Patent No. 4465539 discloses a configuration for a memory control system. In this system, if a change is made to the configuration or operating frequency of a memory, a memory access test automatically starts without a wait at a minimum voltage in starting the system.

In this configuration, if access to the memory cannot be done through the memory access test, the memory access test is retried with the supply voltage raised. If the memory access is done this time, the voltage at that time is determined to be a minimum operating supply voltage. However, if it is still difficult to get the memory access done even when the supply voltage is set to be the maximum value, a wait is inserted and the number of waits is increased on a clock-by-clock basis before the memory access test is retried. Repeating the memory access test in this manner minimizes the number of waits inserted in the memory access. Further, since the supply voltage used during actual memory access is determined to be the minimum required one, the memory access can be speeded up with the power dissipation cut down.

SUMMARY

When dynamic control is made to a supply voltage to be supplied to the IF circuit during normal data transmission/reception, the wait state of the IF circuit varies due to the change of the supply voltage. Thus, in writing or reading data to or from the external memory, the AC timing window may shift or may have its width either broadened or narrowed, along the time axis. As a result, in the conventional configuration, data latch timing becomes out of sync with the AC timing, and thus interface between the IF circuit and the external memory is no longer established. Therefore, data transmission/reception may no longer be performed normally.

In view of the foregoing, it is therefore an object of the present disclosure to provide a semiconductor integrated circuit which allows for performing data transmission/reception normally while dynamically controlling the supply voltage.

To overcome the above-described problems, the present disclosure proposes the following solution. Specifically, the present disclosure provides a semiconductor integrated circuit operating with a voltage supplied from a first power supply IC, and transmitting and receiving data to and from an external memory. The semiconductor integrated circuit includes: an interface circuit which operates with a voltage supplied from a second power supply IC different from the first power supply IC and which accesses the external memory to transmit and receive data to and from the external memory; a determination circuit which determines, based on a result of the access done by the interface circuit, an alternate current (AC) timing specification between the external memory and the interface circuit, and which generates control information for controlling an output voltage of the second power supply IC in accordance with the AC timing specification; and a voltage control circuit which controls the output voltage of the second power supply IC in accordance with the control information.

According to this configuration, for example, when the semiconductor integrated circuit is starting up or operating normally, the voltage supplied from the second power supply IC to the interface circuit is controllable in accordance with the AC timing specification between the external memory and the interface circuit. Thus, during data transmission/reception between the external memory and the interface circuit, the output voltage of the second power supply IC is dynamically controllable such that data latch timing falls within the AC timing window. That is, this semiconductor integrated circuit allows for transmitting and receiving data normally while dynamically controlling the supply voltage.

Meanwhile, a data interface system includes the semiconductor integrated circuit, the first power supply IC, the second power supply IC, and the external memory which receives a voltage supplied from the second power supply IC.

This configuration provides a data interface system which allows for transmitting and receiving data with good stability with the power dissipation cut down.

The present disclosure provides a semiconductor integrated circuit which allows for transmitting and receiving data normally while dynamically controlling the supply voltage.

DETAILED DESCRIPTION

<First Embodiment>

Figure 1:
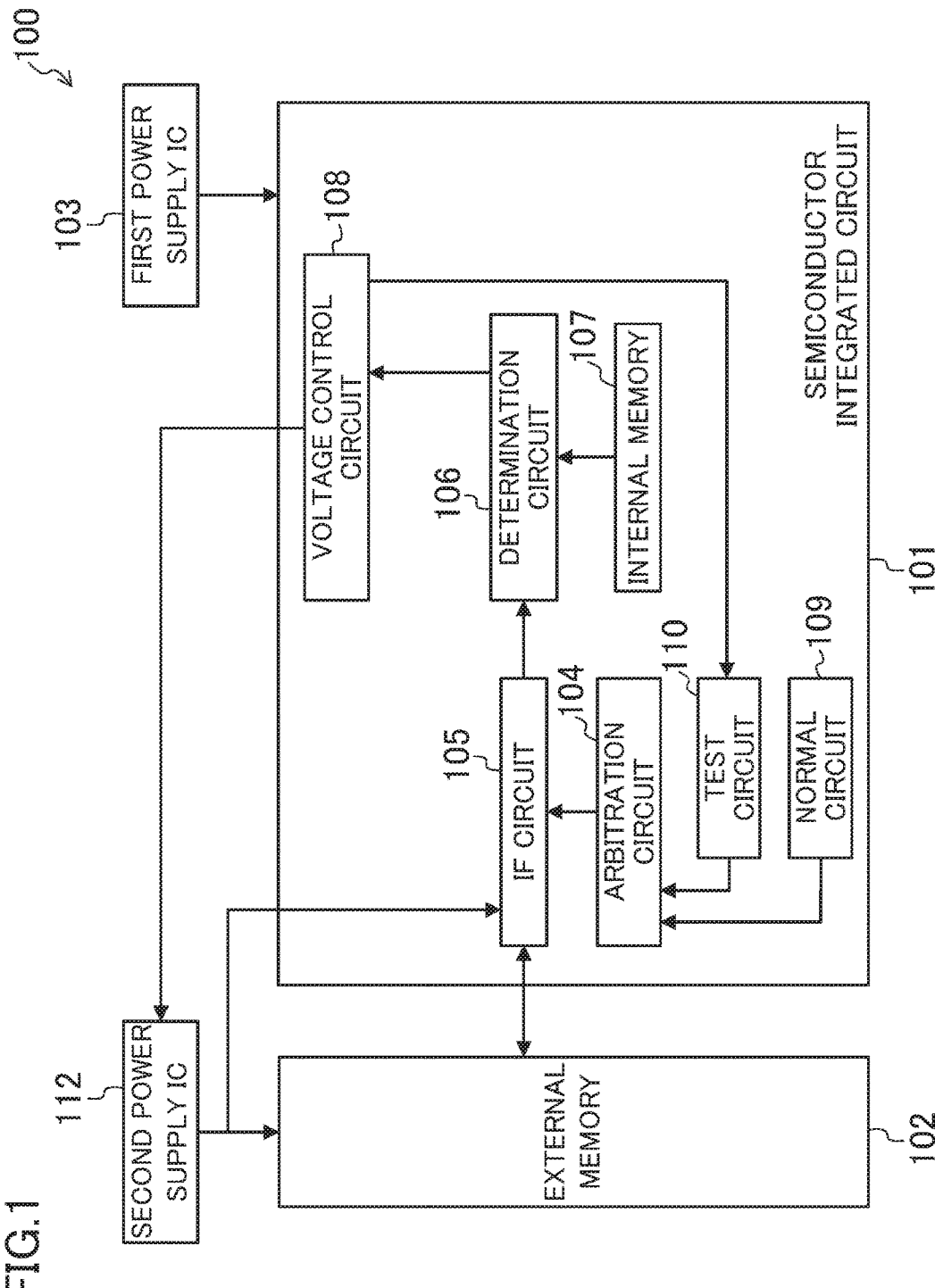
FIG. 1 is a diagram illustrating a configuration for a data interface system including a semiconductor integrated circuit according to a first embodiment.

FIG. 1 is a diagram illustrating a configuration for a data interface system including a semiconductor integrated circuit according to a first embodiment.

This data interface system 100 includes a semiconductor integrated circuit 101, an external memory 102, a first power supply IC 103, and a second power supply IC 112. In the data interface system 100, the semiconductor integrated circuit 101 which receives a voltage supplied from the first power supply IC 103 transmits and receives data to and from the external memory 102 which receives a voltage supplied from the second power supply IC 112.

The semiconductor integrated circuit 101 includes an IF circuit 105, a determination circuit 106, a voltage control circuit 108, a test circuit 110, a normal circuit 109, an arbitration circuit 104, and an internal memory 107 as a table circuit.

The IF circuit 105 operates on receiving a voltage supplied from the second power supply IC 112. Specifically, the IF circuit 105 accesses the external memory 102 to read or write data from or to the external memory 102.

The test circuit 110 instructs the IF circuit 105 to carry out an access test to the external memory 102 in sync with the timing of output from the voltage control circuit 108. In response, the IF circuit 105 carries out the access test to the external memory 102.

The normal circuit 109 instructs the IF circuit 105 to make normal access to the external memory 102 during actual operation of the data interface system 100.

The arbitration circuit 104 arbitrates between the instruction from the test circuit 110 to carry out the access test and the instruction from the normal circuit 109 to make the normal access. For example, if the voltage control circuit 108 instructs the test circuit 110 to start the access test during the actual operation of the data interface system 100, the arbitration circuit 104 relays the instruction from the test circuit 110 to the IF circuit 105.

The determination circuit 106 is configured to evaluate an AC timing specification between the external memory 102 and the IF circuit 105. Specifically, the determination circuit 106 determines the AC timing specification between the external memory 102 and the IF circuit 105 based on the result of the access by the IF circuit 105, i.e., the result of the access test. Then, the determination circuit 106 generates control information for controlling the output voltage of the second power supply IC 112 in accordance with the AC timing specification. For example, the determination circuit 106 compares the AC timing specification with a predetermined value stored in the internal memory 107, and generates control information indicating that the output voltage of the second power supply IC 112 be lowered if the AC timing specification is larger than the predetermined value. On the other hand, if the AC timing specification is smaller than the predetermined value, the determination circuit 106 generates control information indicating that the output voltage of the second power supply IC 112 be raised.

The determination circuit 106 may be configured as, for example, a variable delay element, and may determine a range (a window) in which data provided by the external memory 102 corresponds with an expected value by searching for timings of writing and reading data to and from the external memory 102. Note that the determination circuit 106 may have any arbitrary configuration.

The internal memory 107 stores, as the predetermined value, for example, an AC timing specification based on design information of the semiconductor integrated circuit 101 and control information indicating a value of the voltage to be output by the second power supply IC 112, both of which are associated with each other. Although the internal memory 107 will be described in detail later, the internal memory 107 just needs to store minimum required information to evaluate the AC timing specification.

The voltage control circuit 108 controls the output voltage of the second power supply IC 112 in accordance with the control information generated by the determination circuit 106. The voltage control circuit 108 also instructs the test circuit 110 to start the access test. That is, the output of the voltage control circuit 108 triggers the evaluation of the AC timing specification by the determination circuit 106.

In the semiconductor integrated circuit 101 with such a configuration, all of the other circuits but the IF circuit 105 operate with a voltage supplied from the first power supply IC 103.

Figure 2:
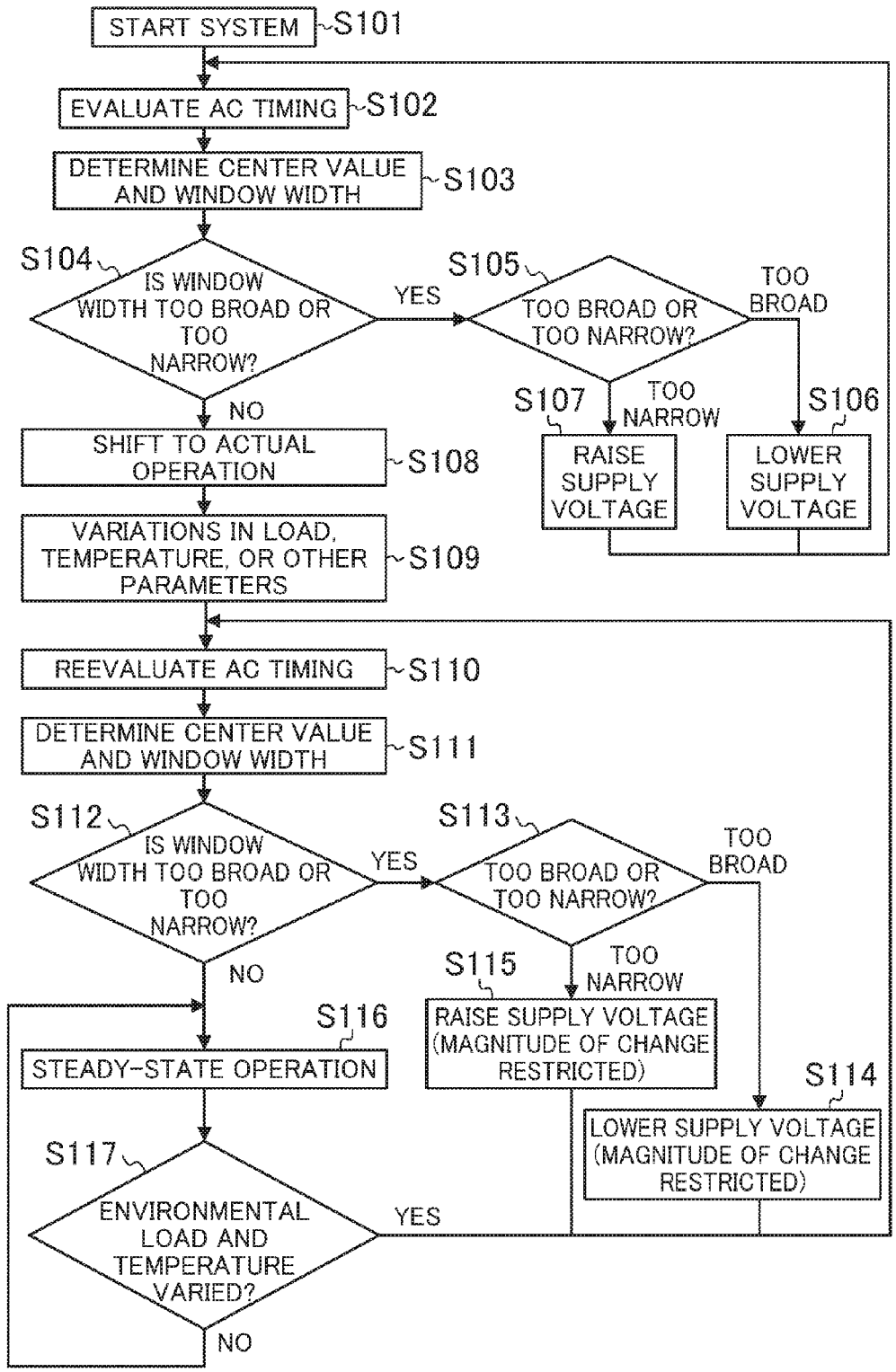
FIG. 2 is a flowchart showing the procedure of voltage control to be performed by the semiconductor integrated circuit shown in FIG. 1.

Referring to FIG. 2, it will be described how the data interface system 100 of the present embodiment operates and performs voltage control.

First, a voltage is supplied from the first power supply IC 103 to the semiconductor integrated circuit 101 to operate the circuits in the semiconductor integrated circuit 101, and supply voltage information based on the design information of the semiconductor integrated circuit 101 is input from the voltage control circuit 108 to the second power supply IC 112. As a result, voltages are supplied from the second power supply IC 112 to the external memory 102 and the IF circuit 105 to start up the system (in S101).

After the startup of the system, the voltage control circuit 108 issues to the test circuit 110 a trigger for starting the evaluation of an AC timing specification. In response, the determination circuit 106 detects the AC timing, and thus write or read timing is determined.

Specifically, the determination circuit 106 acquires pieces of information for the AC timing such as the upper and lower limit values and center value of the timing window, and a delay value with respect to a reference time. Note that the delay value with respect to the reference time is, for example, the amount of time defined by a time delay with respect to a point in time when an AC timing search is started.

In accordance with the AC timing specification thus obtained, timing of transmitting/receiving data to/from the external memory 102 is set to be the center value of the window. Further, the window width is calculated based on the upper and lower limit values of the window (in S103).

Then, the minimum required window width for stable data transmission/reception is compared with the window width obtained in Step S103 to determine whether the window width is too broad or too narrow (in S104). To establish data transmission/reception with good stability between the external memory 102 and the IF circuit 105, the AC timing specification needs to have some width. For this reason, the minimum required window width for the data transmission/reception is stored in advance in the internal memory 107 such that the AC timing specification obtained by the determination circuit 106 is compared with the stored information.

If the window width is too broad or too narrow (if the answer is YES in Step S104), a determination is made whether the window width is too broad or too narrow (in S105).

If the window width is too broad (if the answer is TOO BROAD in Step S105), the determination circuit 106 outputs control information indicating that the voltage of the second power supply IC 112 be lowered to the voltage control circuit 108. In accordance with this instruction, the voltage control circuit 108 lowers the voltage of the second power supply IC 112 (in S106). If the AC timing specification obtained by the determination circuit 106 is larger than the minimum required window width, the data transmission/reception can be performed stably, but the supply voltages supplied to the external memory 102 and the IF circuit 105 are lowered to turn the window width into the minimum required one.

On the other hand, if the window width is too narrow (if the answer is TOO NARROW in Step S105), the determination circuit 106 outputs control information indicating that the voltage of the second power supply IC 112 be raised to the voltage control circuit 108. In accordance with this instruction, the voltage control circuit 108 raises the voltage of the second power supply IC 112 (in S107). If the AC timing specification obtained by the determination circuit 106 is smaller than the minimum required window width, data cannot be transmitted or received stably to and from the external memory 102. Thus, the voltage control circuit 108 raises the supply voltages supplied to the external memory 102 and the IF circuit 105, thereby broadening the window width. This allows for ensuring a required window width for stable data transmission/reception.

After Step S106 or S107, the process returns to S102 to execute reevaluation of the AC timing specification. That is, after the predetermined supply voltage has been changed, the voltage control circuit 108 issues a trigger to the test circuit 110.

This series of processing steps are repeatedly performed until the window width turns into the minimum required one. Thus, the window width is prevented from going too broad or too narrow, and the voltage output from the second power supply IC 112 is optimized. This allows for reducing the power dissipation.

If the window width is neither too broad nor too narrow (if the answer is NO in Step S104), the data interface system 100 shifts to actual operation (in S108). That is, the IF circuit 105 makes normal access in accordance with the instruction from the normal circuit 109.

During the actual operation of the data interface system 100, parameters of the semiconductor integrated circuit 101 such as a load and a temperature may vary (in S109). Due to these variations, the AC timing window width may possibly vary from its reference value. Thus, the voltage control circuit 108 issues a trigger again to the test circuit 110, and thus the AC timing specification is reevaluated (in S110).

As a result of the reevaluation of the AC timing specification by the determination circuit 106, the center value and the window width are calculated based on the AC timing specification during the actual operation of the data interface system 100 (in S111). Further, the determination circuit 106 determines whether the window width is too broad or too narrow (in S112).

If the window width is too broad or too narrow (if the answer is YES in Step S112), a determination is made whether the window width is too narrow or too broad (in S113). If the window width is too broad (if the answer is TOO BROAD in Step S113), the determination circuit 106 outputs control information indicating that the voltage of the second power supply IC 112 be lowered to the voltage control circuit 108. In accordance with this instruction, the voltage control circuit 108 lowers the voltage of the second power supply IC 112 (in S114).

On the other hand, if the window width is too narrow (if the answer is TOO NARROW in Step S113), the determination circuit 106 outputs control information indicating that the voltage of the second power supply IC 112 be raised to the voltage control circuit 108. In accordance with this instruction, the voltage control circuit 108 raises the voltage of the second power supply IC 112 (S115).

In Steps S114 and S115, the data interface system 100 is actually operating. Thus, the IF circuit 105 is performing normal access in accordance with the instruction from the normal circuit 109. Therefore, in Steps S114 and S115, the output voltage of the second power supply IC 112 needs to be controlled while the normal access is being performed properly. Thus, during the actual operation, the output voltage of the second power supply IC 112 is controlled differently from the output voltage of the second power supply IC 112 during the startup of the system.

Specifically, restriction is placed on the magnitude of change of the output voltage of the second power supply IC 112 by performing evaluation of the AC timing specification once. For example, the magnitude of change of the output voltage of the second power supply IC 112 is restricted such that the center value of the window before changing the voltage, i.e., the timing of data transmission/reception, falls within the window width after the voltage change.

Thus, if the window width is too broad (if the answer is TOO BROAD in Step S113), the output voltage of the second power supply IC 112 is lowered such that the center value before the voltage change falls within the window width after the voltage change (in S114).

On the other hand, if the window width is too narrow (if the answer is TOO NARROW in Step S113), the output voltage of the second power supply IC 112 is raised such that the center value before the voltage change falls within the window width after the voltage change (in S115).

In this manner, the magnitude of change of the voltage of the second power supply IC 112 during the actual operation is set to be a different one from that during the startup of the system.

After Step S114 or S115, the process returns to Step S110, and this series of processing steps are performed repeatedly until the AC timing window width is no longer too broad or too narrow. This allows for dynamic optimization of the output voltage of the second power supply IC 112, thereby cutting down the power dissipation of the semiconductor integrated circuit 101. In addition, the data interface system 100 is still allowed to perform data transmission/reception normally even if the second power supply IC 112 is controlled dynamically.

When the window width is no longer too broad or too narrow, the data interface system 100 resumes steady-state operation (in S116).

Next, it will be described what if parameters such as the load of data transmission/reception and the temperature of the semiconductor integrated circuit 101 (the temperature of the IF circuit 105) vary (S117) in the steady-state operation.

The AC timing window width may possibly be affected by a variation in the load of transmitting/receiving data between the external memory 102 and the IF circuit 105 and a variation in temperature of the semiconductor integrated circuit 101.

Specifically, as the frequency of data transmission/reception between the external memory 102 and the IF circuit 105 increases, the AC timing window width becomes narrower and narrower due to power integrity and signal integrity, which makes it increasingly difficult to transmit and receive data stably between the external memory 102 and the IF circuit 105. Further, as the temperature of the semiconductor integrated circuit 101 rises, the drive performance of the IF circuit 105 declines, and thus the AC timing window width tends to be narrower.

As can be seen, if the frequency of data transmission/reception between the semiconductor integrated circuit 101 and the external memory 102 and/or the temperature of the semiconductor integrated circuit 101 varies, and if the magnitudes of the variations in these parameters exceed their threshold values, for example, the voltage control circuit 108 issues to the test circuit 110 a trigger for reevaluating the AC timing specification.

Thus, while data is being transmitted or received through the normal access by the normal circuit 109, the arbitration circuit 104 allows the test circuit 110 to carry out the access test preferentially so as to perform the reevaluation of the AC timing specification by the determination circuit 106 (in S110). Then, the same series of processing steps from Step S111 on are repeatedly performed until the AC timing window width is optimized. Thus, the window width can be kept at least equal to a minimum required one for the data transmission/reception, and the output voltage of the second power supply IC 112 at least equal to the minimum required level even in the steady-state operation. This allows for stabilizing the data transmission/reception and reducing power dissipation.

According to conventional techniques, the output voltage of a single power supply (corresponding to the first power supply IC 103) is controlled in accordance with the state of a load inside the semiconductor integrated circuit 101.

On the other hand, according to the present embodiment described above, the first and second power supply ICs 103 and 112 are used to perform dynamic control of the supply voltages supplied to the IF circuit 105 and the semiconductor integrated circuit 101. The level of the load inside the semiconductor integrated circuit 101 is often different from that of the load of data transmission/reception between the external memory 102 and the IF circuit 105. Thus, in the present embodiment, optimum voltages are supplied from independent power supply ICs to these circuits.

Next, it will be described in further detail how to control the output voltage of the second power supply IC 112 during the steady-state operation.

If the output voltage of the second power supply IC 112 is going to be changed to make the window width proper, the AC timing specification needs to be maintained such that data is transmitted and received normally between the external memory 102 and the IF circuit 105. Thus, the center value before changing the output voltage of the second power supply IC 112 needs to fall within the window width after the voltage change.

Figure 3:
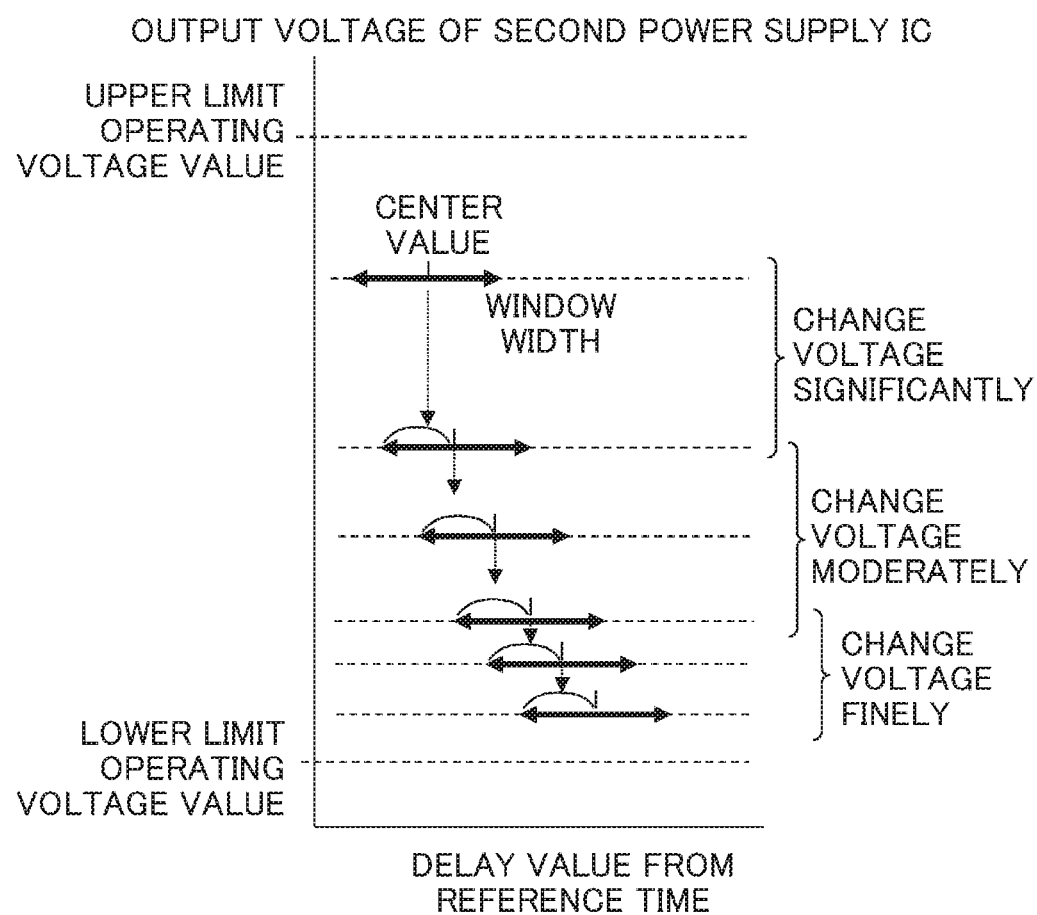
FIG. 3 shows a relationship between a time delay from a reference time, a supply voltage, and a window in the determination circuit shown in FIG. 1.

FIG. 3 shows how a delay value from a reference time, upper and lower limit values and center value of the window, and the window width change with the output voltage of the second power supply IC 112 in the determination circuit 106 shown in FIG. 1.

As shown in FIG. 3, after the excess or shortage of the AC timing window width due to the variation in the load of data transmission/reception between the semiconductor integrated circuit 101 and the external memory 102 or the variation in the temperature of the semiconductor integrated circuit 101 has been solved to allow the output voltage of the second power supply IC 112 to converge, the AC timing window width becomes constant irrespective of the output voltage.

If the output voltage has converged to a high value, it can be said that the load of data transmission/reception between the semiconductor integrated circuit 101 and the external memory 102 is high, and the temperature of the semiconductor integrated circuit 101 is also high. On the other hand, if the output voltage has converged to a low value, it can be said that the load of data transmission/reception between the semiconductor integrated circuit 101 and the external memory 102 is low, and the temperature of the semiconductor integrated circuit 101 is also low.

As shown in FIG. 3, during the steady-state operation, the closer the output voltage of the second power supply IC 112 gets to the lower limit operating voltage value, the more significantly the delay value from the reference time varies with respect to the magnitude of change of the output voltage. Thus, if the output voltage of the second power supply IC 112 is relatively close to the lower limit operating voltage value, the magnitude of change of the voltage needs to be set to be relatively small every time the AC timing specification is evaluated once.

On the other hand, the closer the output voltage of the second power supply IC 112 gets to the upper limit operating voltage value, the less significantly the delay value from the reference time varies with respect to the magnitude of change of the output voltage. Thus, if the output voltage of the second power supply IC 112 is relatively close to the upper limit operating voltage value, the magnitude of change of the voltage may be set to be relatively large every time the AC timing specification is evaluated once.

Thus, by making the output voltage variable between the upper and lower limit operating voltage values in this manner, the number of times of controls to be performed to turn the output voltage into a suitable one is reducible, and yet the output voltage is able to follow up with the suitable one more easily. This allows for performing voltage control appropriately in a voltage range where the semiconductor integrated circuit 101 is operable while maintaining stable data transmission/reception between the IF circuit 105 and the external memory 102.

Optionally, the magnitude of change of the output voltage may also be set to be constant instead of being variable.

Next, data stored in advance in the internal memory 107 and a method for referring to the data will be described below.

The internal memory 107 stores the value of the required window width to maintain stable data transmission/reception between the semiconductor integrated circuit 101 and the external memory 102. This value of the window width is called by the determination circuit 106 every time the AC timing specification is evaluated, and is used as a reference value for comparison.

In starting up the system, data is transmitted and received not through the normal access between the external memory 102 and the normal circuit 109, but through the access test performed between the external memory 102 and the test circuit 110. Thus, the internal memory 107 needs to store in advance, data indicating what the relationship between the output voltage of the second power supply IC 112 and the window width should be on the condition of the load by transmitting or receiving predetermined data from/at the test circuit 110.

The determination circuit 106 locates, in the internal memory 107 storing the window width, an address corresponding to the window width obtained by the evaluation of the AC timing specification during the startup of the system, and obtains an output voltage value corresponding to that address.

Then, the determination circuit 106 calculates the difference between the output voltage value corresponding to the required window width and the current output voltage value, and outputs the differential value as the control information to the voltage control circuit 108.

The voltage control circuit 108 changes the output voltage of the second power supply IC 112 in accordance with this control information.

On the other hand, during the actual operation of the semiconductor integrated circuit 101, there is a constraint that the center value of the window before changing the output voltage of the second power supply IC 112 needs to fall within the window after changing the output voltage so as to keep transmitting/receiving data normally between the external memory 102 and the IF circuit 105 through the normal access. Thus, the internal memory 107 needs to store, in advance, the relationship between the output voltage of the second power supply IC 112 and the magnitude of change of the output voltage with respect to the delay value from the reference time, for example, as shown in FIG. 3. Note that the magnitude of change of the output voltage to be stored is set such that the center value of the data transmission/reception timing specification before changing the output voltage falls within the AC timing window after changing the output voltage.

Based on the delay value from the reference time obtained through the evaluation of the AC timing specification, the determination circuit 106 locates an address storing the corresponding delay value from the reference time in the internal memory 107, and obtains the magnitude of change of the output voltage corresponding to the delay value.

Then, the determination circuit 106 outputs, as the control information, the magnitude of change thus obtained to the voltage control circuit 108.

The voltage control circuit 108 changes the output voltage of the second power supply IC 112 in accordance with the control information provided by the determination circuit 106.

The data stored in advance in the internal memory 107 is not limited to data prepared during the manufacturing process of the semiconductor integrated circuit 101 based on the design information of the semiconductor integrated circuit 101.

For example, a test may be performed to see if the system starts up or actually operates properly during a pre-shipment inspection of the manufactured semiconductor integrated circuits 101 such that measured values corresponding to the respective semiconductor integrated circuits 101 are stored as data in the internal memory 107. That is to say, the data in the internal memory 107 may be set by performing trimming during the pre-shipment inspection of the semiconductor integrated circuits 101 or calibration during the startup of the system.

In reading the actual measurement data stored in the internal memory 107, the determination circuit 106 locates an address storing the information about the window width so as to obtain the corresponding output voltage value during the startup of the system. During the actual operation, the determination circuit 106 may locate an address storing the reference time so as to obtain the corresponding output voltage value.

Further, while the system is being started up after shipment of the semiconductor integrated circuit 101, the output voltage of the second power supply IC 112 may be varied to evaluate the AC timing specification at various voltage values so as to obtain data about the delay value from the reference time, the upper and lower limit values and center value of the window, and the window width. Then, the data thus obtained may be stored as a table in the internal memory 107.

As can be seen from the foregoing description, the data interface system 100 according to the present embodiment allows for dynamic control of the voltages supplied to the IF circuit 105 and the external memory 102 in accordance with the AC timing specification between the external memory 102 and the IF circuit 105. This allows for reducing the power dissipation of the semiconductor integrated circuit 101 while maintaining stable data transmission/reception between the external memory 102 and the IF circuit 105.

Such dynamic control of the voltage in accordance with the AC timing specification allows for finer adjustment of timing of the data transmission/reception than clock-by-clock adjustment.

The AC timing specification is supposed to be evaluated if the load or the temperature varies in Steps S109 and S117 shown in FIG. 2. However, for example, a timer or other means may be provided such that the AC timing specification is evaluated every time a given time has passed.

<Second Embodiment>

Figure 4:
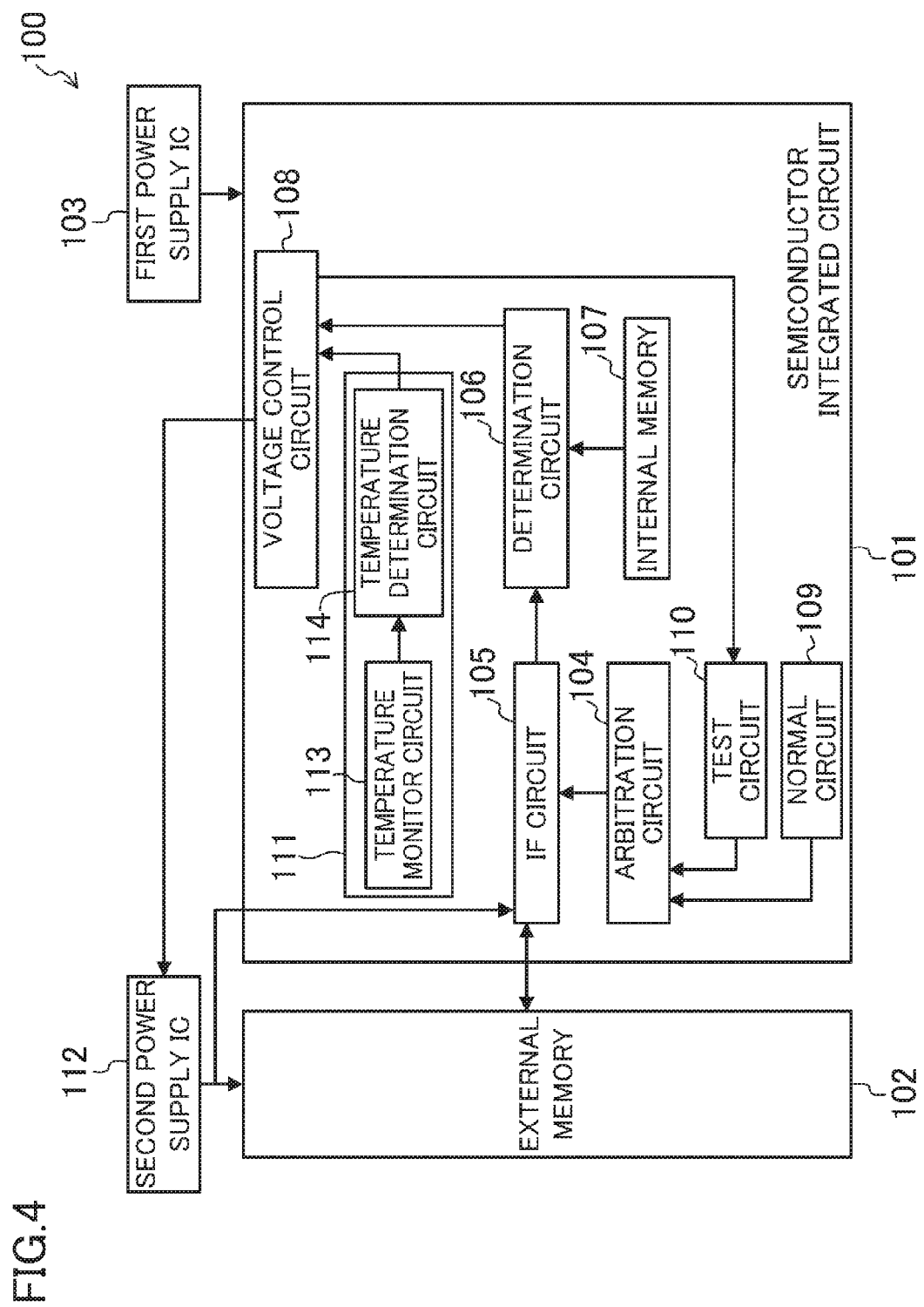
FIG. 4 is a diagram illustrating a configuration for a data interface system including a semiconductor integrated circuit according to a second embodiment.

FIG. 4 is a diagram illustrating a configuration for a data interface system including a semiconductor integrated circuit according to a second embodiment. The following description of the second embodiment will be focused on the differences between the first and second embodiments.

The semiconductor integrated circuit 101 shown in FIG. 4 includes, in addition to every component of the semiconductor integrated circuit 101 shown in FIG. 1, a temperature sensor 111.

The temperature sensor 111 includes a temperature monitor circuit 113 which monitors the temperature of the IF circuit 105 and a temperature determination circuit 114 which provides the voltage control circuit 108 with information indicating that the temperature of the IF circuit 105 has changed by a predetermined value or more based on the monitoring results obtained by the temperature monitor circuit 113.

Now, it will be described specifically how the semiconductor integrated circuit 101 according to the present embodiment operates. Note that the flow in starting up the system is the same as that of the first embodiment (see FIG. 2).

During the actual operation of the data interface system 100, the temperature monitor circuit 113 monitors the temperature of the IF circuit 105 and outputs the monitored temperature to the temperature determination circuit 114. The temperature determination circuit 114 stores the output of the temperature monitor circuit 113. For example, the temperature of the IF circuit 105 after starting up the system is stored immediately after the actual operation.

Thereafter, during the actual operation, the temperature of the IF circuit 105 is output from the temperature monitor circuit 113 to the temperature determination circuit 114. If the temperature of the IF circuit 105 has changed by a predetermined value or more from the stored temperature, the temperature determination circuit 114 informs the voltage control circuit 108 of that temperature change. Note that the temperature determination circuit 114 may inform the voltage control circuit 108 that the temperature of the IF circuit 105 is a predetermined value.

The voltage control circuit 108 issues a trigger to the test circuit 110 based on the timing of output from the temperature determination circuit 114. That is, the voltage control circuit 108 instructs the test circuit 110 to start the access test.

As a result, the determination circuit 106 performs evaluation of the AC timing specification, and the output voltage of the second power supply IC 112 is controlled dynamically. Thus, even if the temperature of the semiconductor integrated circuit 101 varies, the window width is kept constant. This allows for maintaining stable data transmission/reception.

After the voltage control circuit 108 has adjusted the output voltage of the second power supply IC 112, the temperature monitor circuit 113 monitors the temperature periodically or constantly. If the temperature has changed by a predetermined value or more, or if the temperature is a predetermined value, the temperature determination circuit 114 informs the voltage control circuit 108 of that. That is to say, the temperature sensor 111 executes the processing related to Steps S109 and S117 shown in FIG. 2.

As can be seen from the foregoing description, according to the present embodiment, even if the load of data transmission/reception between the external memory 102 and the IF circuit 105 is constant, the AC timing specification is reevaluated when the temperature of the semiconductor integrated circuit 101 varies, thereby allowing for readjustment of the output voltage of the second power supply IC 112. This makes it possible to keep the window width constant, and to perform stable data transmission/reception between the external memory 102 and the IF circuit 105, even if the temperature varies.

<Third Embodiment>

Figure 5:
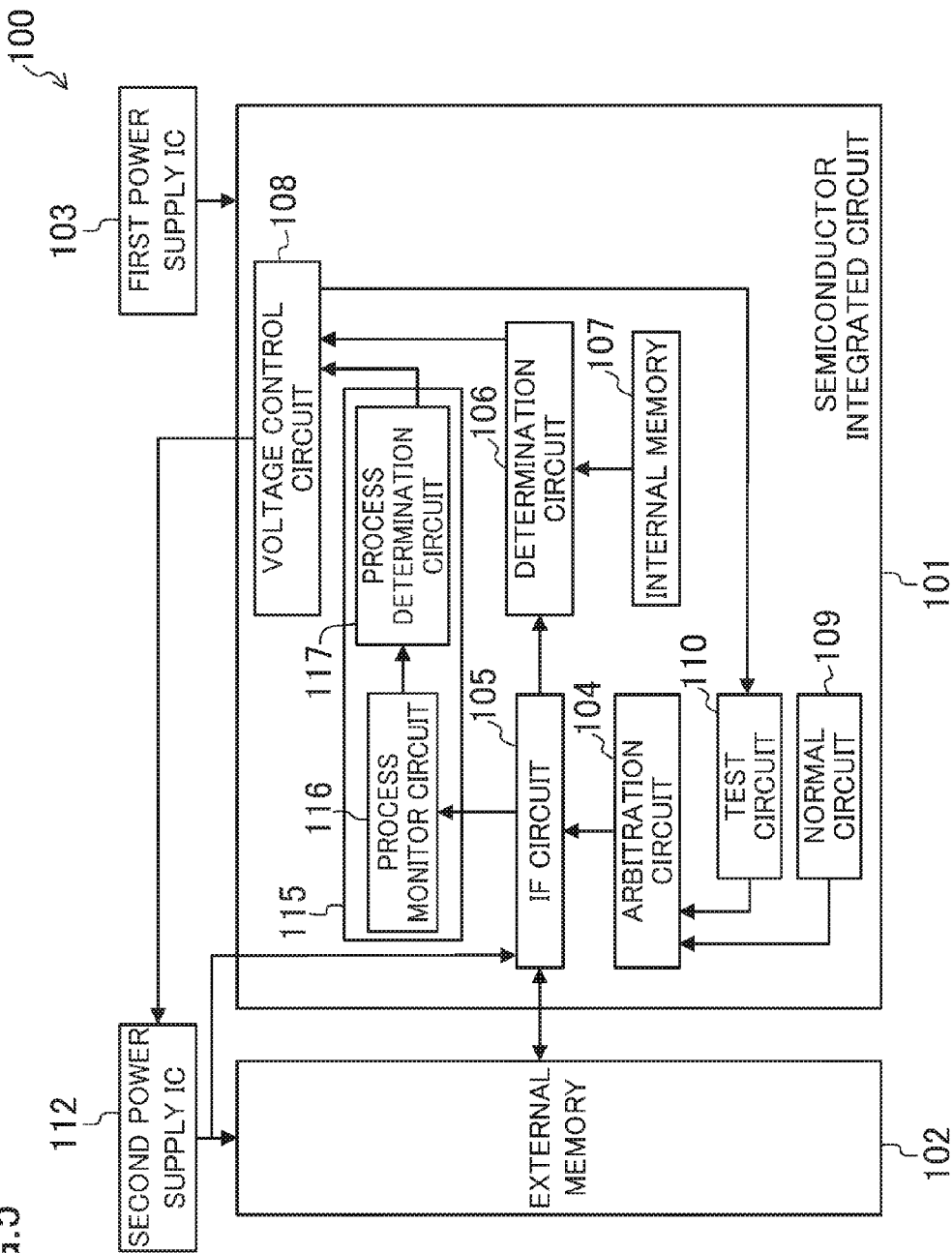
FIG. 5 is a diagram illustrating a configuration for a data interface system including a semiconductor integrated circuit according to a third embodiment.

FIG. 5 is a diagram illustrating a configuration for a data interface system including a semiconductor integrated circuit according to a third embodiment. The following description of the third embodiment will be focused on the differences between the first and third embodiments.

A semiconductor integrated circuit 101 shown in FIG. 5 includes, in addition to every component of the semiconductor integrated circuit 101 shown in FIG. 1, a process sensor 115.

The process sensor 115 includes a process monitor circuit 116 which monitors the process induced variation of an individual IF circuit 105 built in the semiconductor integrated circuit 101, and a process determination circuit 117 which outputs data about a voltage to be output by the second power supply IC 112 based on the monitoring results obtained by the process monitor circuit 116.

For example, the process monitor circuit 116 monitors a physical quantity indicative of various parameters of the transistor in the IF circuit 105, such as current drivability. The process determination circuit 117 determines, based on the physical quantity, whether or not the process induced variation of the IF circuit 105 falls within the predetermined tolerance range.

Specifically, the process determination circuit 117 compares the monitoring results obtained by the process monitor circuit 116 with a reference physical quantity trimmed during a pre-shipment inspection of the semiconductor integrated circuit 101, thereby determining the magnitude of the deviation of the physical quantity of the individual IF circuit 105 from the center value of the predetermined tolerance range.

Next, it will be described specifically how the semiconductor integrated circuit 101 of the present embodiment operates. In starting up the system, the process monitor circuit 116 monitors the process induced variation of the IF circuit 105, and outputs the monitoring results to the process determination circuit 117. The process determination circuit 117 determines, in response to the output of the process monitor circuit 116, the magnitude of the deviation of the above-described physical quantity from the center value of the predetermined tolerance range. Then, the process determination circuit 117 transforms the magnitude of the deviation into a voltage value, and outputs the transformed voltage value to the voltage control circuit 108.

The voltage control circuit 108 adjusts the output voltage of the second power supply IC 112 based on the voltage value provided by the process determination circuit 117.

The supply voltage value during the startup of the system varies according to the process induced variation of the given semiconductor integrated circuit 101. Thus, by taking the output of the process sensor 115 into consideration, the semiconductor integrated circuit 101 may be started up with a suitable voltage. Thereafter, the series of processing steps from Step S102 shown in FIG. 2 on will be performed.

Such a dispersion resulting from the process induced variations of those individual semiconductor integrated circuits 101 is reflected on the results obtained through the evaluation of the AC timing specification. Thus, the AC timing specification on which the dispersion resulting from the process induced variations is reflected is compared with the data in the internal memory 107, the magnitude of change of the voltage is calculated based on the magnitude of excess or shortage of the window width, and then the voltage control circuit 108 is provided with that information.

The voltage control circuit 108 controls the output voltage of the second power supply IC 112 based on the magnitude of change of the voltage obtained through the evaluation of the AC timing specification and information about the voltage obtained by transforming the magnitude of deviation provided by the process sensor 115. Thus, the window width becomes no longer too broad or too narrow. The same is applied to the semiconductor integrated circuit 101 shifted to the actual operation.

As can be seen from the foregoing description, according to the present embodiment, there is no need to store, in the internal memory 107, parameters such as the supply voltage, data about the window width, and the delay value from the reference time with respect to the process induced variation of each individual semiconductor integrated circuit 101. Thus, the internal memory 107 may have a smaller storage capacity. Further, using the data in the internal memory 107, a suitable magnitude of change of the voltage may be calculated for each individual semiconductor integrated circuit 101 having its own process induced variation.

Next, specific processing to be performed by the process determination circuit 117 will be described below. For example, the monitoring results obtained by the process monitor circuit 116 are compared with the center value of the predetermined tolerance range. If the transistor in the IF circuit 105 has high current drivability, the voltage control circuit 108 receives information indicating that voltage be lowered by constant amplitude determined through trimming during the pre-shipment inspection.

To the voltage during the startup of the system, added is the information provided by the process determination circuit 117 indicating that voltage be lowered by constant amplitude, thereby controlling the output voltage of the second power supply IC 112. Then, the voltage is supplied to the IF circuit 105 and the external memory 102.

If the transistor has low current drivability, information indicating that voltage be raised by constant amplitude may be output as the above-described information.

As can be seen from the foregoing description, the present embodiment allows for voltage control while taking the process induced variation of each individual semiconductor integrated circuit 101 into consideration.

<Fourth Embodiment>

Figure 6:
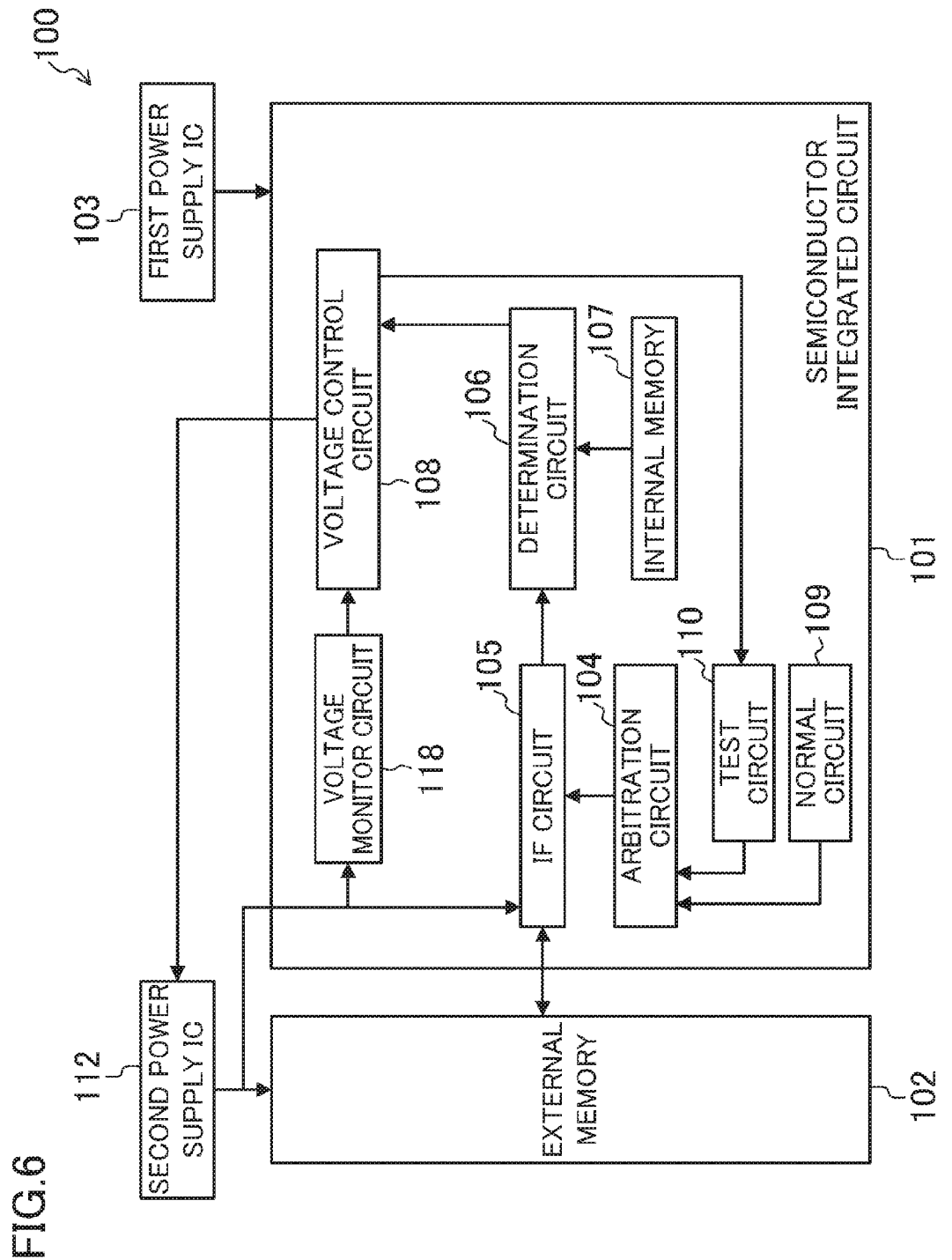
FIG. 6 is a diagram illustrating a configuration for a data interface system including a semiconductor integrated circuit according to a fourth embodiment.

FIG. 6 is a diagram illustrating a configuration for a data interface system including a semiconductor integrated circuit according to a fourth embodiment. The following description of the fourth embodiment will be focused on the differences between the first and fourth embodiments.

The semiconductor integrated circuit 101 shown in FIG. 6 includes, in addition to every component of the semiconductor integrated circuit 101 shown in FIG. 1, a voltage monitor circuit 118.

The voltage monitor circuit 118 monitors the voltage supplied from the second power supply IC 112 to the IF circuit 105, and informs the voltage control circuit 108 that the voltage has changed by a predetermined value or more or that the voltage is a predetermined value.

It will be described specifically how the semiconductor integrated circuit 101 according to the present embodiment operates. The flow from the startup of the system to the actual operation is the same as that of the first embodiment (see Steps S101-S108 of FIG. 2).

After the shift to the actual operation, the voltage monitor circuit 118 monitors the voltage supplied to the IF circuit 105, and stores the value of the voltage. If the load of data transmission/reception between the IF circuit 105 and the external memory 102 varies, the voltage supplied to the IF circuit 105 also varies. Thus, if the voltage has changed by a predetermined value or more or if the voltage is a predetermined value, the voltage monitor circuit 118 informs the voltage control circuit 108 that the AC timing specification needs to be evaluated.

The voltage control circuit 108 outputs a trigger to the test circuit 110 in sync with the timing of output from the voltage monitor circuit 118. Thus, the evaluation of the AC timing specification is performed.

In the present embodiment, the variation in the output voltage of the second power supply IC 112 may be regarded as the variations of the load indicated in Steps S109 and S117 shown in FIG. 2.

As can be seen from the foregoing description, according to the present embodiment, the variation in the load of data transmission/reception between the external memory 102 and the IF circuit 105 is detectable by monitoring the voltage supplied to the IF circuit 105. This allows for reevaluation of the AC timing specification and readjustment of the output voltage of the second power supply IC 112. Therefore, stability of data transmission/reception between the external memory 102 and the IF circuit 105 is ensured with the AC timing window width kept constant.

In the present embodiment, the load of data transmission/reception between the external memory 102 and the IF circuit 105 is used as a requirement triggering reevaluation of the AC timing specification. However, the load placed on the IF circuit 105 may be determined by monitoring the wait for a command to be issued to the arbitration circuit 104 (queue), a data toggle rate of the IF circuit 105, and a data pattern such as the rate of simultaneous data change so that the determination results may also be used as a trigger requirement. Alternatively, the load placed on the IF circuit 105 may be monitored by a user program of the semiconductor integrated circuit 101, and the monitoring result may also be used as a trigger requirement.

Further, in the above-described embodiments, the determination circuit 106 may be provided with a memory such that control information based on the AC timing specification is generated. In such a case, the internal memory 107 may be omitted.

The semiconductor integrated circuit disclosed herein allows for stable data transmission/reception while performing dynamic voltage control, and thus is useful for reducing power dissipation of various types of systems involving data communications.

What is claimed is:

1. A semiconductor integrated circuit operating with a voltage supplied from a first power supply integrated circuit (IC) to transmit and receive data to and from an external memory, the first power supply IC dynamically changing an output voltage of the first power supply IC, the semiconductor integrated circuit comprising:

an interface circuit which operates with a voltage, as a power supplying voltage, supplied from a second power supply IC different from the first power supply IC and which accesses the external memory to transmit and receive data to and from the external memory, the second power supply IC changing an output voltage of the second power supply IC independently from the first power supply IC;

a determination circuit which determines, based on a result of the access done by the interface circuit, an alternate current (AC) timing specification between the external memory and the interface circuit, and which generates control information for controlling the output voltage of the second power supply IC in accordance with the AC timing specification; and a voltage control circuit which controls the output voltage of the second power supply IC in accordance with the control information.

2. The semiconductor integrated circuit of claim 1, wherein the determination circuit generates the control information indicating that the output voltage of the second power supply IC be lowered if the AC timing specification is larger than a predetermined value, and generates the control information indicating that the output voltage of the second power supply IC be raised if the AC timing specification is smaller than the predetermined value.

3. The semiconductor integrated circuit of claim 1, further comprising:

a test circuit which instructs the interface circuit to carry out an access test to the external memory;

a normal circuit which instructs the interface circuit to make normal access to the external memory; and an arbitration circuit which arbitrates between the instruction from the test circuit to carry out the access test and the instruction from the normal circuit to make the normal access, wherein the voltage control circuit instructs the test circuit to start the access test, and the determination circuit generates the control information based on the AC timing specification obtained as a result of the access test.

4. The semiconductor integrated circuit of claim 1, further comprising:

a temperature sensor which senses a temperature of the interface circuit and which outputs information indicating that the temperature has changed by a predetermined value or more or that the temperature is a predetermined value, wherein the voltage control circuit controls the output voltage of the second power supply IC in sync with timing of output of the information from the temperature sensor.

5. The semiconductor integrated circuit of claim 1, further comprising:

a process sensor which senses the interface circuit's own process induced variation, and which outputs information about a voltage to be output by the second power supply IC based on the process induced variation, wherein the voltage control circuit controls the output voltage of the second power supply IC in accordance with the output of the process sensor.

6. The semiconductor integrated circuit of claim 1, further comprising:

a voltage monitor circuit which senses a voltage supplied from the second power supply IC to the interface circuit and outputs information indicating that the voltage has changed by a predetermined value or more or that the voltage is a predetermined value, wherein the voltage control circuit controls the output voltage of the second power supply IC in sync with timing of output of the information from the voltage monitor circuit.

7. The semiconductor integrated circuit of claim 1, further comprising:

a table circuit which stores information about a voltage to be output by the second power supply IC, wherein the determination circuit generates the control information by reference to the table circuit.

8. The semiconductor integrated circuit of claim 7, wherein the table circuit stores a value of the voltage to be output by the second power supply IC and an AC timing specification associated with the value, the AC timing being set to transmit and receive data normally between the interface circuit and the external memory.

9. The semiconductor integrated circuit of claim 8, wherein the AC timing specification stored in the table circuit is set such that a center value of the AC timing specification after the voltage control circuit has changed the voltage of the second power supply IC falls within a range of the AC timing specification before the voltage of the second power supply IC is changed.

10. The semiconductor integrated circuit of claim 7, wherein data stored in the table circuit is set by trimming performed during a pre-shipment inspection of the semiconductor integrated circuit or by calibration performed during a startup of the semiconductor integrated circuit.

11. A data interface system comprising:

the semiconductor integrated circuit of claim 1;

the first power supply IC;

the second power supply IC; and the external memory which receives a voltage supplied from the second power supply IC.

* * * * *